United States Patent
Kon et al.

(10) Patent No.: US 7,220,628 B2
(45) Date of Patent: May 22, 2007

(54) SEMICONDUCTOR DEVICE AND MANUFACTURING METHOD THEREOF, AND GATE ELECTRODE AND MANUFACTURING METHOD THEREOF

(75) Inventors: Junichi Kon, Kawasaki (JP); Koji Nozaki, Kawasaki (JP); Kozo Makiyama, Kawasaki (JP); Toshihiro Ohki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 314 days.

(21) Appl. No.: 11/022,987

(22) Filed: Dec. 28, 2004

(65) Prior Publication Data

US 2006/0046446 A1  Mar. 2, 2006

(30) Foreign Application Priority Data

Aug. 31, 2004  (JP) .............................. 2004-253520

(51) Int. Cl.
*H01L 21/338* (2006.01)
(52) U.S. Cl. ............................... 438/182; 257/E21.014
(58) Field of Classification Search ................. 438/182
See application file for complete search history.

(56) References Cited

U.S. PATENT DOCUMENTS

| | | | |
|---|---|---|---|
| 6,204,102 B1 * | 3/2001 | Yoon et al. ................. | 438/182 |
| 6,503,671 B1 | 1/2003 | Nakajima | |
| 6,555,607 B1 | 4/2003 | Kanda et al. | |
| 6,759,287 B2 * | 7/2004 | Koh ........................... | 438/182 |
| 7,041,541 B2 * | 5/2006 | Behammer ................. | 438/182 |
| 2003/0119233 A1 * | 6/2003 | Koganei ..................... | 438/182 |
| 2006/0223245 A9 * | 10/2006 | Pellens et al. .............. | 438/167 |

FOREIGN PATENT DOCUMENTS

| | | |
|---|---|---|
| EP | 1 429 185 | 6/2004 |
| JP | 61-284969 | 12/1986 |
| JP | 5-197151 | 8/1993 |

(Continued)

OTHER PUBLICATIONS

Takeo Ishibashi et al.; The Japan Society of Applied Physics, vol. 40, Part 1, No. 1, pp. 419-425, Jan. 2001.

(Continued)

*Primary Examiner*—W. David Coleman
(74) *Attorney, Agent, or Firm*—Westerman, Hattori, Daniels & Adrian, LLP.

(57) ABSTRACT

A method for manufacturing a semiconductor device includes a step of forming a layer where a gate electrode aperture is to be formed including at least one ultraviolet resist layer on the surface where a gate electrode is to be formed, and forming a gate electrode aperture in the layer where a gate electrode aperture is to be formed; a step of forming a layer where an over-gate is to be formed in which an over-gate part of a gate electrode is to be formed, on the layer where a gate electrode aperture is to be formed; a step of reducing the width of the gate electrode aperture; and a step of forming the gate electrode in the gate electrode aperture. The method makes it possible to efficiently produce a fine gate electrode by thickening the gate electrode aperture and reducing the width of the gate electrode aperture.

50 Claims, 7 Drawing Sheets

FOREIGN PATENT DOCUMENTS

| | | |
|---|---|---|
| JP | 7-153666 | 6/1995 |
| JP | 7-193088 | 7/1995 |
| JP | 10-73927 | 3/1998 |
| JP | 10-107044 | 4/1998 |
| JP | 11-204399 | 7/1999 |
| JP | 11-352692 | 12/1999 |
| JP | 2000-267268 | 9/2000 |
| JP | 2000-347414 | 12/2000 |
| JP | 2001-19860 | 1/2001 |
| JP | 2001-33984 | 2/2001 |
| JP | 2001-189283 | 7/2001 |
| JP | 2001-228616 | 8/2001 |
| JP | 2002-6491 | 1/2002 |
| JP | 2002-49161 | 2/2002 |
| JP | 2003-131400 | 5/2003 |
| JP | 3476080 | 9/2003 |
| JP | 2004-53723 | 2/2004 |
| JP | 2004-61668 | 2/2004 |
| WO | WO2004/21450 | 3/2004 |

OTHER PUBLICATIONS

Mamoru Terai et al.; Advanced Technology R&D Center, Proceedings of SPIE, vol. 5039, pp. 789-797, 2003.

* cited by examiner

SEMICONDUCTOR DEVICE AND MANUFACTURING METHOD THEREOF, AND GATE ELECTRODE AND MANUFACTURING METHOD THEREOF

CROSS-REFERENCE TO RELATED APPLICATIONS

This application is based upon and claims the benefits of the priority from the prior Japanese Patent Application No. 2004-253520, filed on Aug. 31, 2004, the entire contents of which are incorporated herein by reference.

BACKGROUND OF THE INVENTION

1. Field of the Invention

The present invention relates to a method for manufacturing a gate electrode and a method for manufacturing a semiconductor device, which make it possible to manufacture efficiently a fine gate electrode, and relates to a gate electrode and a semiconductor device manufactured by the method for manufacturing a gate electrode and the method for manufacturing a semiconductor device.

2. Description of the Related Art

A field-effect transistor with excellent high frequency properties is useful for a transmitting and receiving device of quasi-millimeter and millimeter band waves and a high-speed signal processing (optical communication) device. In the developments of the gate electrode used for the device, particularly in which excellent high frequency properties are required, up to now there has been extensive effort on making the gate forming aperture as fine as possible and the gate length as short as possible. As a means for making the gate forming aperture finer, the following have been developed (Japanese Patent Application Laid-Open UP-A) No. 2001-19860 and JP-A No. 2004-87967),
(1) a method in which drawing is carried out in fine detail by shortening the exposure source wave length for drawing or refining the electron beam diameter,
(2) a method in which the opening dimensions are reduced by thermosoftening according to the heat-treatment of the resist making the gate forming aperture,
(3) a method in which the opening dimensions are reduced by heat treatment after the part around the gate electrode forming aperture, which forms the gate forming aperture, is thickened by irradiating an electron beam.

However, there are the following problems in these methods. Namely, in the case of the (1), the exposure device and the mask is expensive in price, causing the entire cost for manufacturing to be expensive. In the case of the (3), it is not suited for mass-production from the viewpoints of throughput and safety because the method uses an electron beam. On the other hand, in the case of the above-mentioned (2), because the amount of the reduction of the opening dimensions obtained stably is about 0.04 μm or less, reducing the opening dimensions drastically beyond this creates problems in the uniformity, and is not suited for mass-production.

An object of the present invention is to solve the problems in conventional technologies and provide a method for manufacturing a gate electrode and a method for manufacturing a semiconductor device, which make it possible to manufacture a fine gate electrode efficiently, by thickening the gate electrode aperture formed by regular ultraviolet exposure and by reducing the opening dimensions, and to provide a gate electrode and a high quality semiconductor device with the gate electrode being suited for a field-effect transistor which has excellent high frequency properties and is useful for a transmitting and receiving device of quasi-millimeter and millimeter band waves and a high-speed signal processing (optical communication) device.

SUMMARY OF THE INVENTION

The present invention provides, in an aspect, a method for manufacturing a semiconductor device, including a step of forming a layer where a gate electrode aperture is to be formed including at least one ultraviolet resist layer on the surface where a gate electrode is to be formed, and forming a gate electrode aperture in the layer where a gate electrode aperture is to be formed; a step of forming a layer where an over-gate is to be formed in which an over-gate part of a gate electrode is to be formed, on the layer where a gate electrode aperture is to be formed; a step of reducing the width of the gate electrode aperture; and a step of forming the gate electrode in the gate electrode aperture.

According to the aspect of the present invention, in the step of forming the gate electrode aperture, the layer where a gate electrode aperture is to be formed including at least one ultraviolet resist layer is formed on the surface where the gate electrode is to be formed, and the gate electrode aperture is formed in the layer where a gate electrode aperture is to be formed; in the step of forming the layer where an over-gate is to be formed, the layer where an over-gate is to be formed in which the over-gate part of the gate electrode is to be formed is formed; in the step of reducing the width of the gate electrode aperture, the width of the gate electrode aperture is reduced; and in the step of forming a gate electrode, the gate electrode is formed in the gate electrode aperture.

Therefore, semiconductor devices having high performance and a fine gate electrode are manufactured efficiently and easily. In the semiconductor devices, it is possible that field-effect transistors having fine gate electrodes can be integrated stably and a plurality of gate electrodes with different levels of refinement can be formed. This enables the semiconductor device to be superior in multifunctionality and performance.

A semiconductor device of the present invention is manufactured using the method for manufacturing a semiconductor device of the present invention.

The semiconductor device of the present invention has high performance because it has a fine gate electrode which is suited for a field-effect transistor etc. Moreover, the semiconductor device is superior in multifunctionality and performance, especially with a plurality of gate electrodes having different levels of refinement and with a plurality of off-set gates in which the off-set level is adjusted arbitrarily.

The present invention provides, in another aspect, a method for manufacturing a gate electrode, including a step of forming a layer where a gate electrode aperture is to be formed including at least one ultraviolet resist layer on the surface where a gate electrode is to be formed, and forming a gate electrode aperture in the layer where a gate electrode aperture is to be formed; a step of forming a layer where an over-gate is to be formed in which an over-gate part of a gate electrode is to be formed, on the layer where a gate electrode aperture is to be formed; a step of reducing the width of the gate electrode aperture; and a step of forming the gate electrode in the gate electrode aperture.

According to the aspect of the present invention, in the step of forming the gate electrode aperture, the layer where a gate electrode aperture is to be formed including at least one ultraviolet resist layer is formed on the surface where the gate electrode is to be formed, and the gate electrode aperture is formed in the layer where a gate electrode aperture is to be formed; in the step of forming the layer where an over-gate is to be formed, the layer where an over-gate is to be formed in which the over-gate part of the gate electrode is to be formed is formed; in the step of reducing the width of the gate electrode aperture, the width of the gate electrode aperture is reduced; and in the step of forming the gate electrode, the gate electrode is formed in the gate electrode aperture. Therefore, a fine gate electrode having high performance is manufactured efficiently and easily. The gate electrode has a short gate length and a fine structure, so that it can be used favorably for a field-effect transistor which has excellent high frequency properties and is useful for a transmitting and receiving device of quasi-millimeter and millimeter band waves and a high-speed signal processing (optical communication) device.

Figure 1A:
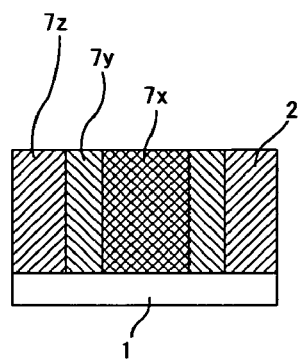
FIGS. 1A to 1E are schematic drawings describing a mechanism in which the gate electrode aperture is reduced by a resist pattern thickening material.

DESCRIPTION OF THE PREFERRED EMBODIMENTS (Gate Electrode and Semiconductor Device and Manufacturing Methods Thereof)

A method for manufacturing a semiconductor device and method for manufacturing a gate electrode of the present invention include, a step of forming a gate electrode aperture, a step of forming a layer where an over-gate is to be formed, a step of reducing the width of a gate electrode aperture, and a step of forming a gate electrode, and moreover, other steps are included as necessary.

The semiconductor device of the present invention is manufactured with use of the method for manufacturing a semiconductor device of the present invention, and the gate electrode of the present invention is fabricated with use of the method for manufacturing a gate electrode of the present invention.

Hereinafter, the method for manufacturing the semiconductor device and the method for manufacturing the gate electrode of the present invention will be described, and the contents of both semiconductor device and gate electrode will be made clear through the description.

Step of Forming a Gate Electrode Aperture

The step of forming the gate electrode aperture is that a layer where a gate electrode aperture is to be formed containing at least one ultraviolet resist layer is formed on the surface where the gate electrode is to be formed, and the gate electrode aperture is formed on the layer where a gate electrode aperture is to be formed.

Surface where a Gate Electrode is to be Formed

The surface where a gate electrode is to be formed is not particularly limited, and can be suitably selected according to the purpose. Examples thereof are the surface where a gate electrode is to be formed in various semiconductor devices and the like. Among these, the surface where a gate electrode is to be formed in a field-effect transistor is given as a favorable example, which is useful for a transmitting and receiving device of quasi-millimeter and millimeter band waves and a high-speed signal processing (optical communication) device.

Examples of the surface where a gate electrode is to be formed are the surface of substrate of a semiconductor device or the like; specifically, a substrate of a silicon wafer, an insulating interlayer, a wiring material film, various oxide films, a low-resistance layer.

It is preferable that an ohmic electrode be formed on the surface where a gate electrode is to be formed. In this case, at least a pair of ohmic electrodes is preferably formed. The ohmic electrode is not particularly limited and may be suitably selected from the known art. For instance, exemplified is the one where a buffer layer, an InGaAs electron transit layer, an AlGaAs electron donor layer, and a GaAs low-resistance layer are laminated on a semi-insulating GaAs substrate. Each layer on the ohmic electrode can be laminated with use of, for instance, an MOCVD method etc. An active region can be formed by injecting oxygen in order to separate the elements mutually electrically.

Moreover, when the surface where a gate electrode is to be formed is the surface of a low-resistance layer, a recess region may be formed by removing the low-resistance layer part through an etching process etc.

Layer where a Gate Electrode Aperture is to be Formed

The layer where a gate electrode aperture is to be formed is not particularly limited and may be suitably selected in accordance with the purpose as long as it contains at least one layer of an ultraviolet resist layer and is able to form a gate electrode aperture. However, it is preferable that an incompatibility layer not compatible with the layer where an over-gate is to be formed described later be furthermore included in addition to the ultraviolet resist layer.

In this case, in the layer where an over-gate is to be formed there is an advantage in the point that a mushroom gate electrode can be formed efficiently. Moreover, in this case, when the layer where a gate electrode aperture is to be formed has the incompatibility layer and the ultraviolet resist layer in this order on the surface where a gate electrode is to be formed, the gate electrode aperture can be formed on the incompatibility layer caused by the ultraviolet resist layer. Therefore, there is an advantage in the point that the layer where an over-gate is to be formed can be formed on the incompatibility layer.

The resist material for the ultraviolet resist layer is not particularly limited and may be suitably selected from the known art. Although exemplified are a g-line resist and an i-line resist, the i-line resist is preferable from the viewpoint of forming a fine gate electrode.

A concrete example of the resist material is preferably one which is highly compatible with a resin involved in the resist pattern thickening material described later, such as a novolac resist, acrylic resist, cycloolefin-maleic anhydride (COMA) resist, cycloolefin resist, PHS resist, and hybrid (alicyclic acrylate-COMA copolymer) resist, etc. Fluorine modification etc. may be carried out on them. These may be used singly, or two or more may be used in combination. Among these, the novolac resin is particularly preferable.

The thickness of the ultraviolet resist layer is not particularly limited and may be suitably selected according to the material of the surface where a gate electrode is to be formed and the etching conditions. For instance, it is usually about 0.05 to 2000 μm.

The opening dimensions where the gate electrode aperture is formed on the ultraviolet resist layer is not particularly limited and may be suitably selected. The wavelength of the exposure beam, used for exposing the ultraviolet resist layer in the case where the gate electrode aperture is formed on the ultraviolet resist layer, is not particularly limited and may be suitably selected from the ultraviolet region according to the resist material of the ultraviolet resist layer. Where the resist material is a g-line resist, a g-line wavelength is preferable and, on the other hand, where it is an i-line resist, an i-line wavelength is preferable.

The incompatibility layer can be suitably provided in the following cases; (a) when the layer where an over-gate is to be formed cannot be formed caused by the ultraviolet resist layer being compatible with the layer where an over-gate is to be formed when the layer where an over-gate is to be formed described later is formed on the ultraviolet resist layer on which the gate electrode aperture is formed; and (b) when the connectivity of both layers is not good enough even if the ultraviolet resist layer is not compatible with the layer where an over-gate is to be formed.

Where the incompatibility layer is provided, the gate electrode aperture can be transferred onto the incompatibility layer by etching the incompatibility layer using the ultraviolet resist layer, in which the gate electrode aperture is formed, after forming the gate electrode aperture in the ultraviolet resist layer.

The incompatibility layer is preferably formed on the surface where the gate electrode is to be formed. It is more preferable that the incompatibility layer is formed on the surface where a gate electrode is to be formed, on which part a pair of ohmic electrodes (source electrode and drain electrode) and recess region are formed.

The material for the incompatibility layer is not particularly limited and can be suitably selected according to the purpose. However, it depends on the material of the layer where an over-gate is to be formed (described later) which is formed on the incompatibility layer, therefore preferable materials cannot be clearly defined unconditionally. When the layer where an over-gate is to be formed is an undercut resist layer described later, the material is preferably, for instance, at least one selected from the group of acrylate resin, polyester resin, polystyrene resin, polyether resin, polyolefin resin, epoxy resin, polyamide resin, and polyimide resin. Particularly, polymethyl methacrylate resin is preferable among them, and, for instance, SiN is preferable when the layer where an over-gate is to be formed is the multi-layer resist described later.

An ultraviolet resist being incompatible with the layer where an over-gate is to be formed described later may be used for the material of the incompatibility layer. In this case, because the property of the incompatibility layer changes from photosensitive to non-photosensitive and the mixing properties are controlled by applying the surface treatment to the incompatibility layer by light and heat, it is possible that the ultraviolet resist layer is formed on the incompatibility layer and patterned. It is an advantage from the viewpoint of simplifying the step.

The incompatibility layer may be composed of one layer or a plurality of layers, and the thickness of the incompatibility layer is not particularly limited and can be suitably selected according to the purpose. It is usually about 0.01 μm to 2 μm.

Commercial items can be used suitably as a material for the layer where a gate electrode aperture is to be formed.

The method for manufacturing the layer where a gate electrode aperture is to be formed is not particularly limited and can be suitably selected in accordance with the purpose. A known coating method is given as a preferable example, for instance, a spin-coating method.

The method for forming the gate electrode aperture on the layer where a gate electrode aperture is to be formed is not particularly limited and can be suitably selected according to the purpose. For instance, the method can be the one having the steps of exposing the ultraviolet resist layer with ultraviolet rays using a well-know mask pattern, and developing it. Moreover, when the layer where a gate electrode aperture is to be formed includes the incompatibility layer, the method can be the one where the gate electrode aperture is formed by etching the incompatibility layer using the ultraviolet resist layer as the mask pattern after exposing the ultraviolet resist layer with ultraviolet using a known mask pattern, and developing it. In the latter case, it is preferable that the ultraviolet resist layer be removed before the step of forming the layer where an over-gate is to be formed described later.

Step of Forming a Layer where an Over-Gate is to be Formed

The step of forming a layer where an over-gate is to be formed is a step in which a layer where an over-gate is to be formed is manufactured on the layer where a gate electrode aperture is to be formed to form an over-gate part of the gate electrode.

The layer where an over-gate is to be formed can be formed on the layer where a gate electrode aperture is to be formed, and it can be suitably formed on the incompatibility layer when the layer where a gate electrode aperture is to be formed includes the incompatibility layer.

The layer where an over-gate is to be formed is not particularly limited as long as it forms the over-gate part of the gate electrode. The layer where an over-gate is to be formed can be suitably selected according to the kind of gate electrode forming layer, for instance, the undercut resist layer and multi-layer resist are given as the preferable examples.

The undercut resist layer is not particularly limited and can be selected from the known art according to the purpose. For instance, a negative resist layer is given as an example, in which the undercut shape is formed by dissolving the non-exposed part after exposing and developing, and the one including novolac resin, optical acid generator, crosslinking agent and azo dye is given as the preferable example.

The undercut resist layer can be preferably formed when the incompatibility layer is formed by at least one material selected from the group consisting of acrylate resin, polyester resin, polystyrene resin, polyether resin, polyolefin resin, epoxy resin, polyamide resin, and polyimide resin. Particularly, it can be preferably formed where it is formed with use of polymethyl methacrylate resin.

The multi-layer resist is not particularly limited and can be suitably selected according to the purpose. Given as a preferable example is one including a layer capable of side etching and an ultraviolet resist layer, particularly preferable is the one including a polydimethyl glutarimide (PMGI) resist layer and an ultraviolet resist layer.

The multi-layer resist can be preferably formed where the incompatibility layer is formed with use of SiN.

The material of the layer which can be side-etched (setback formation) is not particularly limited as long as it is the material being able to side-etch, and can be suitably selected according to the purpose. For instance, a polydimethyl glutarimide (PMGI) resist etc. is given as a preferable example.

When side-etching (setback formation) is carried out for the layer being able to side-etch, it is possible that the space formed by it can be used for the space to form the over-gate part of the gate electrode.

The material of the ultraviolet resist layer is not particularly limited and can be suitably selected in accordance with the purpose. For instance, the materials mentioned above can be given as the preferable example.

The thickness of the layer where an over-gate is to be formed is not particularly limited, and can be suitably selected according to the purpose.

The opening dimensions to be formed in the layer where an over-gate is to be formed is not particularly limited and can be selected according to the purpose. For instance, about 0.20 to 1.00 µm is preferable. The method for forming an aperture in the layer where an over-gate is to be formed is not particularly limited. A known exposure and development method can be preferably given according to the purpose following a known condition.

Commercial items can be suitably used as a material for the layer where an over-gate is to be formed.

The layer where an over-gate is to be formed can be formed by a known coating method. The coating method is not particularly limited and can be suitably selected from the known art according to the purpose, for instance, a spin-coating method etc.

It is preferable that the layer where an over-gate is to be formed be removed along with the incompatibility layer after the step of forming the gate electrode. For instance, a lift-off method is given as a preferable example of the method for removing the layer where an over-gate is to be formed.

Step of Reducing the Width of a Gate Electrode Aperture

The step of reducing the width of the gate electrode aperture is a step reducing the opening width (opening dimensions and opening area) of the gate electrode aperture.

The step of reducing the width of the gate electrode aperture is not particularly limited and can be suitably selected according to the purpose. For instance, it is preferable that the step be carried out by coating a resist pattern thickening material containing resin on the area including at least the gate electrode aperture in the layer where a gate electrode aperture is to be formed in which the gate electrode aperture is formed, thus thickening the layer where a gate electrode aperture is to be formed.

In this case, when the resist pattern thickening material is coated on the gate electrode aperture, the thickness of the gate electrode aperture is increased and the mixing layer is formed on the gate electrode aperture, resulting in the opening width (opening dimensions and opening area) being reduced. As a result, a finer gate electrode aperture is formed exceeding the exposure limit of the exposure light (ultraviolet rays) used for forming the gate electrode aperture (as if it were exposed with use of ionizing radiation with a shorter wavelength than that of the exposure light (ultraviolet rays)).

The amount of increase of the thickness of the gate electrode aperture, that is, the amount of reduction of the opening width (opening dimensions and opening area) of the gate electrode aperture can be suitably controlled to be in a desired range by adjusting the composition, composition ratio, blending quantity, concentration, viscosity, thickness of the coating layer, and mixing bake temperature and time, of the resist pattern thickening material.

The composition, composition ratio, blending quantity, concentration, and viscosity etc. of the resist pattern thickening material, are not particularly limited and can be suitably selected according to the purpose. The preferable total content of the components of the resist pattern thickening material except for water is 5 to 40% by mass from the viewpoint of controlling the amount of increase of the thickness of the gate electrode aperture, that is, the amount of reduction of the opening width (opening dimensions and opening area) of the gate electrode aperture.

The number of times of the step of reducing the gate electrode aperture is not particularly limited. The step is usually carried out once, but may be carried out two or more times.

The timing of the step of reducing the gate electrode aperture is not particularly limited and can be suitably selected according to the purpose. For instance, before and/or after the step of forming the layer where an over-gate is to be formed is given as a preferable example.

Resist Pattern Thickening Material

The resist pattern thickening material contains at least resins and, in addition, suitably selected as necessary, it may contain surfactants, crosslinking agents, water-soluble aromatic compounds, resins having, in part, aromatic compounds, organic solvents, phase transfer catalysts, and polyhydric alcohol having at least two hydroxyl groups, and it may contain additional components.

The resist pattern thickening material is water-soluble or alkali-soluble.

The water-solubility is not particularly limited and can be suitably selected according to the purpose. For instance, the preferable water-solubility is that 0.1 g or more of the resist pattern thickening material is dissolved in 100 g of water at a water-temperature of 25° C.

The alkali-solubility of the resist pattern thickening material is not particularly limited and can be suitably selected according to the purpose. For instance, the preferable alkali-solubility is that 0.1 g or more of the resist pattern thickening material is dissolved in 100 g of 2.38% by mass tetramethyl ammonium hydroxide (TMAH) aqueous solution at a solution temperature of 25° C. The resist pattern thickening material may be an aqueous solution, a colloid liquid, an emulsion liquid or the like, but an aqueous solution is preferable.

Resin

The resin is not particularly limited and can be suitably selected in accordance with the purpose. The resin is preferably water-soluble or alkali-soluble, and more preferably is capable of a crosslinking reaction or capable of mixing with a water-soluble crosslinking agent.

The resin preferably comprises two or more polar groups in view of exhibiting an excellent water-solubility or alkali-solubility.

The polar group is not particularly limited and can be suitably selected in accordance with the purpose. Preferable examples thereof are a hydroxyl group, an amino group, a sulfonyl group, a carbonyl group, a carboxyl group, derivatives thereof, and the like. The polar group may be contained singly, or two or more may be contained in combination.

When the resin is water-soluble, the water-soluble resin preferably exhibits water solubility of 0.1 g or more in 100 g of water at a water temperature of 25° C., and more preferably exhibits water solubility of 0.3 g or more in 100 g of water at a water temperature of 25° C., and particularly preferably exhibits water solubility of 0.5 g or more in 100 g of water at a water temperature of 25° C.

Examples of the water-soluble resin include polyvinyl alcohol, polyvinyl acetal, polyvinyl acetate, polyacrylic acid, polyvinyl pyrolidone, polyethyleneimine, polyethylene oxide, styrene-maleic acid copolymer, polyvinylamine, polyallylamine, an oxazoline group-containing water-soluble resin, a water-soluble melamine resin, a water-soluble urea resin, an alkyd resin, a sulfonamide resin, and the like.

When the resin is alkali-soluble, the alkali-soluble resin preferably exhibits alkali solubility of 0.1 g or more in 100 g of a 2.38% by mass tetramethyl ammonium hydroxide (TMAH) aqueous solution at a solution temperature of 25° C., and more preferably exhibits alkali solubility of 0.3 g or more in 100 g of 2.38% by mass TMAH aqueous solution at a solution temperature of 25° C., and particularly preferably exhibits alkali solubility of 0.5 g or more in 100 g of 2.38% by mass TMAH aqueous solution at a solution temperature of 25° C.

Examples of the alkali-soluble resin are a novolak resin, a vinylphenol resin, polyacrylic acid, polymethacrylic acid, poly p-hydroxyphenylacrylate, poly p-hydroxyphenyl-methacrylate, a copolymer thereof, and the like.

A resin may be used singly, or two or more thereof may be used in combination. Among these, polyvinyl alcohol, polyvinyl acetal, polyvinyl acetate and the like are preferable. The resin more preferably contains polyvinyl acetal at 5% by mass to 40% by mass.

In the present invention, the resin may be a resin having a cyclic structure at least at a portion thereof, and with use of such resins there is an advantage in the point that excellent etching-resistance properties can be imparted to the resist pattern thickening material.

In the present invention, the resin having a cyclic structure at least at a portion thereof may be used singly, or two or more may be used in combination. Moreover, it may be used together with the resins.

The resin having a cyclic structure at a portion thereof is not particularly limited and can be suitably selected in accordance with the purpose. Those that can cause a crosslinking reaction are preferable. Suitable examples thereof include polyvinyl aryl acetal resins, polyvinyl aryl ether resins, polyvinyl aryl ester resins, and derivatives thereof. It is preferable to use at least one type selected therefrom. From the standpoint of exhibiting water solubility or alkali solubility to an appropriate degree, such a resin that contains an acetyl group is more preferable.

The polyvinyl aryl acetal resins are not particularly limited and may be suitably selected in accordance with the purpose. Examples thereof include β-resorcine and the like.

The polyvinyl aryl ether resins are not particularly limited and may be suitably selected in accordance with the purpose. Examples thereof include 4-hydroxybenzyl ether and the like.

The polyvinyl aryl ester resins are not particularly limited and may be suitably selected in accordance with the purpose. Examples thereof include benzoate and the like.

The method of producing the polyvinyl aryl acetal resins is not particularly limited and may be suitably selected in accordance with the purpose. A suitable example thereof is a known method of producing using a polyvinyl acetal reaction, or the like. Such a producing method is a method in which, for example, polyvinyl alcohol, and aldehyde in an amount needed stoichiometrically for the polyvinyl alcohol are made to undergo an acetalizing reaction in the presence of an acid catalyst. Specifically, suitable examples are the methods disclosed in U.S. Pat. Nos. 5,169,897 and 5,262,270, Japanese Patent Application Laid-Open (JP-A) No. 5-78414, and the like.

The method of producing the polyvinyl aryl ether resins is not particularly limited and may be suitably selected in accordance with the purpose. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction by Williamson); and the like. Specifically, suitable examples are the methods disclosed in JP-A Nos. 2001-40086, 2001-181383, 6-116194, and the like.

The method of producing the polyvinyl aryl ester resins is not particularly limited and may be suitably selected in accordance with the purpose. Examples thereof are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The cyclic structure in the resin having a cyclic structure at a portion thereof, is not particularly limited and may be suitably selected in accordance with the purpose. Examples thereof are monocyclic structure (benzene etc.), polycyclic structure (bisphenol etc.), condensed ring (naphthalene etc.), and more specifically, aromatic compounds, alicyclic compounds, heterocyclic compounds, and the like are preferred. In the resin having a cyclic structure at a portion thereof, a cyclic structure may be used singly or two or more thereof may be used in combination.

Examples of the aromatic compound are a polyhydroxy phenol compound, a polyphenol compound, an aromatic carboxylic acid compound, a naphthalene polyhydroxy compound, a benzophenone compound, a flavonoid compound, a porphin, a water-soluble phenoxy resin, an aromatic-containing water-soluble dye, derivatives thereof, glycosides thereof, and the like. The aromatic compound may be used singly, or two or more may be used in combination.

Examples of the polyhydric phenol compounds are resorcinol, resorcin[4]arene, pyrogallol, gallic acid, derivatives and glycosides thereof, and the like.

Examples of the polyphenol compounds include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, and the like.

Examples of the aromatic carboxylic acid compounds include salicylic acid, phthalic acid, dihydroxy benzoic acid, tannin, and the like.

Examples of the naphthalene polyhydroxy compounds include naphthalene diol, naphthalene triol, and the like.

Examples of the benzophenone compounds include alizarin yellow A, and the like.

Examples of the flavonoid compounds include flavone, isoflavone, flavanol, flavonone, flavonol, flavan-3-ol, aurone, chalcone, dihydrochalcone, quercetin, and the like.

Examples of the alicyclic compound are a polycycloalkane, a cycloalkane, fused rings, derivatives and glycosides thereof, and the like. These may be used singly, or two or more may be used in combination.

Examples of the polycycloalkane are norbornane, adamantane, norpinane, sterane, and the like.

Examples of the cycloalkane are cyclopentane, cyclohexane, and the like.

Examples of the fused rings are steroids and the like.

Suitable examples of the heterocyclic compound include a nitrogen-containing cyclic compound such as pyrrolidine, pyridine, imidazole, oxazole, morpholine, pyrrolidone, and the like; and an oxygen-containing cyclic compound such as furan, pyran, saccharides such as pentose and hexose; and the like.

Preferable examples of the resin having a cyclic structure at a portion thereof are ones having at least one selected from the functional groups such as, for instance, hydroxyl group, cyano group, alkoxyl group, carboxyl group, amino group, amide group, alkoxycarbonyl group, hydroxyalkyl group, sulphonyl group, acid anhydride group, lactone group, cyanate group, and ketone group etc.; and the saccharic derivatives from the viewpoint of water-solubility. The one having at least one functional group selected from the hydroxyl group, amino group, sulphonyl group, carboxyl group, and their derivatives is more preferable.

The molar content ratio of the cyclic structure in the resin having a cyclic structure at a portion thereof, is not particularly limited as long as it does not affect the etching resistance, and may be suitably selected in accordance with the purpose. In the case where high etching resistance is needed, it is preferably 5 mol % or more, and more preferably, 10 mol % or more.

The molar content ratio of a cyclic structure in the resin having a cyclic structure at a portion thereof, can be measured with use of, for instance, NMR etc.

The content of the resins (including the resin having a cyclic structure at a portion thereof) in the resist pattern thickening material can be suitably decided according to the kind and content etc. of the resin without the cyclic structure, the crosslinking agent and surfactant described later.

Surfactant

The surfactants are not particularly limited and may be suitably selected in accordance with the purpose. Examples thereof include nonionic surfactants, cationic surfactants, anionic surfactants, ampholytic surfactants and the like. These may be used singly, or two or more may be used in combination. A suitable one among them is a nonionic surfactant from the point that it does not contain metallic irons.

Preferable examples of the nonionic surfactants are the ones selected from alkoxylate surfactants, fatty acid ester surfactants, amide surfactants, alcoholic surfactants, and ethylenediamine surfactants. The concrete examples thereof include polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, nonyl phenol ethoxylate compounds, octyl phenol ethoxylate compounds, lauryl alcohol ethoxylate compounds, oleyl alcohol ethoxylate compounds, fatty acid ester, amide, natural alcohol, ethylenediamine, secondary alcohol ethoxylate and the like.

The cationic surfactants are not particularly limited and may be suitably selected in accordance with the purpose. Examples thereof include alkyl cationic surfactants, amide quaternary cationic surfactants, ester quaternary cationic surfactants and the like.

The ampholytic surfactants are not particularly limited and may be suitably selected in accordance with the purpose. Examples thereof include amine oxide surfactants, betaine surfactants and the like.

The content of the surfactants in the resist pattern thickening material depends on the kind and content etc. of the resin and crosslinking agent etc., so that it is impossible for it to be prescribed unconditionally. It can be suitably selected according to the purpose, and the preferable value is less than 50 ppm.

Where the layer, in which the gate electrode aperture is formed, is the ultraviolet resist layer and the incompatibility layer, the gate electrode aperture can be reduced to be a desired size even if the content of the surfactants is less than 50 ppm, for instance, even 0 ppm. On the other hand, where the content is 50 ppm or more, it makes it easy to form a mixing layer (compatibility layer) at the bending part of the pattern and the connecting part etc. between the fine pattern and large area pattern, and, thereby, pattern disappearance etc. may occur. For instance, disappearance etc. occurs at the aperture of the finger pattern connected to the pattern for the gate pad.

Crosslinking Agent

The crosslinking agents are not particularly limited and can be suitably selected according to the purpose. Preferable examples are ones which have water-solubility and cause crosslinking by heat or acid, and an amino crosslinking agent is more preferable.

Preferable examples of the amino crosslinking agent are melamine derivatives, urea derivatives, and uril derivatives and the like. These may be used singly, or two or more may be used in combination.

Examples of the urea derivatives include urea, alkoxymethylene urea, N-alkoxymethylene urea, ethylene urea, ethylene urea carboxylic acid, their derivatives and the like.

Examples of the melamine derivatives are alkoxymethyl melamine, their derivatives and the like.

Examples of the uril derivatives are benzoguanamine, glycol uril, their derivatives and the like.

The content of the crosslinking agents in the resist pattern thickening material depends on the kind and content etc. of the resin etc., so that it is impossible for it to be prescribed unconditionally. It can be suitably selected according to the purpose.

Water-Soluble Aroma Compound

The water-soluble aromatic compound is not particularly limited as long as it is an aromatic compound that has water-solubility, and can be suitably selected according to the purpose. The one having water-solubility such that 1 g or more is dissolved into 100 g of water at 25° C. is preferable, and the one having water-solubility such that 3 g or more is dissolved into 100 g of water at 25° C. is more preferable. Particularly, the most preferable is the one having water-solubility such that 5 g or more is dissolved into 100 g of water at 25° C.

When the resist pattern thickening material contains water-soluble aromatic compounds, the preferable point is that the etching resistance of the obtained resist pattern can be remarkably improved because of the cyclic structures involved in the water-soluble aromatic compounds.

Examples of the water-soluble aromatic compound are polyphenol compounds, an aromatic carboxylic acid compound, a naphthalene polyhydroxy compound, a benzophenone compound, a flavonoid compound, a porphin, a water-soluble phenoxy resin, an aromatic-containing water-soluble dye, derivatives thereof, glycoside thereof, and the like. These may be used singly, or two or more may be used in combination.

Examples of the polyphenol compound include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcine, resorcine[4]arene, pyrogallol, gallic acid, and the like.

Examples of the aromatic carboxylic acid compound include salicylic acid, phthalic acid, dihydroxy benzoic acid, tannin, and the like.

Examples of the benzophenone compound include alizarin yellow A, and the like.

Examples of the flavonoid compound include flavone, isoflavone, flavanol, flavonone, flavonol, flavan-3-ol, aurone, chalcone, dihydrochalcone, quercetin, and the like.

These may be used singly, or two or more may be used in combination. The polyphenol compounds are preferable among them, and catechin and resorcine are particularly preferable.

Among the water-soluble aromatic compounds, from the point of excellent water-solubility, the one having two or more polar groups is preferable, the one having three or more is more preferable, and the one having four or more is particularly preferable.

The polar group is not particularly limited and can be suitably selected in accordance with the purpose. Examples thereof are a hydroxyl group, a carboxyl group, a carbonyl group, a sulfonyl group, and the like.

The content of the water-soluble aromatic compounds in the resist pattern thickening material can be decided according to the kind and content etc. of the resin, crosslinking agent, and surfactants etc.

Organic Solvent

The organic solvent is not particularly limited and can be suitably selected in accordance with the purpose. Examples thereof are alcohol organic solvents, linear ester organic solvents, cyclic ester organic solvents, ketone organic solvents, linear ether organic solvents, cyclic ether organic solvents, and the like.

When the resist pattern thickening material contains the abovementioned organic solvent, the advantageous point is that the solubility of the resin and the polyhydric alcohol having at least two of the hydroxyl groups, and the crosslinking agent etc. can be improved in the resist pattern thickening material.

Examples of the alcohol organic solvents are methanol, ethanol, propyl alcohol, isopropyl alcohol, butyl alcohol, and the like.

Examples of the linear ester organic solvents are ethyl lactate, propylene glycol methyl ether acetate (PGMEA), and the like.

Examples of the cyclic ester organic solvents are lactone organic solvents such as γ-butyrolactone, and the like.

Examples of the ketone organic solvents are ketone organic solvents such as acetone, cyclohexanone, and heptanone, and the like.

Examples of the linear ether organic solvents are ethylene glycol dimethyl ether, and the like.

Examples of the cyclic ether organic solvents are tetrahydrofuran, dioxane, and the like.

These organic solvents may be used singly, or two or more thereof may be used in combination. Among them, the one having a boiling point of about 80 to 200° C. is preferable from the viewpoint of being able to finely increase the thickness of the resist pattern.

The content of the organic solvents in the resist pattern thickening material can be decided according to the kind and content etc. of the resin, crosslinking agent, and surfactants etc.

Phase Transfer Catalyst

The phase transfer catalyst is not particularly limited and can be suitably selected in accordance with the purpose. Examples thereof are organic materials, and the like. The preferable example among them is the basic one.

When the resist pattern thickening material contains the phase transfer catalyst, the advantageous point is that the resist pattern is efficiently and uniformly thickened regardless of a material of the resist pattern. With utilization of such resist pattern thickening material, therefore, the thickening effect of the resist pattern is hardly affected by a material of the resist pattern. Such effects of the phase transfer catalyst are not impaired, for instance, even if the resist pattern, which is the subject to be thickened with use of the resist pattern thickening material, contains an acid generating agent or not.

The preferable phase transfer catalyst is the one having water-solubility, and the water-solubility is such that 0.1 g or more can be dissolved in 100 g of water at a water temperature of 25° C.

The concrete examples of the phase transfer catalyst include crown ether, azacrown ether, onium salt compounds, and the like.

The phase transfer catalyst may be used singly, or two or more may be used in combination. Among these, an onium salt compound is preferable from the viewpoint of high performance of water-solubility.

Examples of the crown ether and azacrown ether include 18-Crown-6, 15-Crown-5, 1-Aza-18-crown-6, 4,13-Diaza-18-crown-6, 1,4,7-Triazacyclononane, and the like.

The onium salt compounds are not particularly limited and may be suitably selected in accordance with the purpose. The preferable examples thereof include quarternary ammonium salt, pyridinium salt, thiazolium salt, phosphonium salt, piperazinium salt, ephedrinium salt, quinium salt, cinchonium salt, and the like.

Examples of the quarternary ammonium salt include Tetrabutylammonium hydrogensulfate, Tetramethylammonium acetate, Tetramethylammonium chloride, and the like which are often used for synthetic organic agents.

Examples of the pyridinium salt include Hexadecylpyridinium bromide, and the like.

Examples of the thiazolium salt include 3-Benzyl-5-(2-hydroxyethyl)-4-methylthiazolium chloride, and the like.

Examples of the phosphonium salt include Tetrabutylphosphonium chloride, and the like.

Examples of the piperazinium salt include 1,1-Dimethyl-4-phenylpiperazinium, and the like.

Examples of the ephedrinium salt include (−)-N,N-Dimethylephedrinium bromide, and the like.

Examples of the quinium salt include N-Benzylquininium chloride, and the like.

Examples of the cinchonium salt include N-Benzylcinchoninium chloride, and the like.

The content of the phase transfer catalyst in the resist pattern thickening material depends on the kind and content etc. of the resin etc., so that it is impossible to be prescribed indiscriminately, but it can be suitably selected according to the kind and content etc. For instance, 10,000 ppm or less is preferable, 10 to 10,000 ppm is more preferable, 10 to 5,000 ppm is further preferable, and 10 to 3,000 ppm is particularly preferable.

When the content of the phase transfer catalyst is 10,000 ppm or less, the advantageous point is that the resist pattern such as a line pattern etc. can be thickened independent of the size.

The content of the phase transfer catalyst can be measured with use of, for instance, liquid chromatography.

Polyhydric Alcohol Having at Least Two Hydroxyl Groups

The polyhydric alcohol having at least two hydroxyl groups is not particularly limited and can be suitably selected in accordance with the purpose. Examples thereof are saccharides, derivatives of saccharides, glycosides, naphthalene polyhydric alcohol compound, and the like.

The saccharides are not particularly limited and may be appropriately selected in accordance with the purpose. Examples thereof include pentose, hexose, and the like. The concrete examples of the saccharides include arabinose, fructose, galactose, glucose, ribose, saccharose, maltose, and the like.

The derivatives of saccharides are not particularly limited and can be suitably selected in accordance with the purpose. Preferable examples thereof are amino sugar, saccharic acid, deoxysuga, sugar alcohol, glycal, nucleoside, and the like.

The glycosides are not particularly limited and may be suitably selected in accordance with the purpose. Preferable examples thereof include phenolic glycosides, and the like. Preferable examples of phenolic glycosides are salicin, arbutin, 4-aminophenyl galactopyranoside, and the like.

Examples of the naphthalene polyhydroxy compounds include naphthalene diol, naphthalene triol, and the like.

These may be used singly, or two or more may be used in combination. Among these, the one having aromaticity is preferable from the viewpoint of being possible to add etching resistance to the resist pattern thickening material. Glycosides are preferable, and phenolic glycosides are more preferable.

The content of polyhydric alcohol having at least two hydroxyl groups in the resist pattern thickening material is not particularly limited and can be suitably selected in accordance with the purpose. For instance, the preferable amount is 0.001 to 50 parts by mass against the total amount of the resist pattern thickening material, and the more preferable amount is 0.1 to 10 parts by mass.

When the content of the polyhydric alcohol having at least two hydroxyl groups is less than 0.001 parts by mass, the amount of increased thickness of the resist pattern thickening material may depend on the resist pattern size. On the other hand, when it exceeds 10 parts by mass, there is a possibility that a part of the resist pattern is dissolved depending on the resist material.

Other Components

The other components are not particularly limited as long as they do not interfere with the effects of the present invention, and may be suitably selected in accordance with the purpose. All kinds of known additives, for instance, thermal acid generating agents, quenchers such as amine type, amide type, ammonium chloride type quenchers, etc. are given as the examples.

The content of the other components in the resist pattern thickening material can be decided according to the kind and content etc. of the resin, crosslinking agent, and surfactants etc.

Coating of Resist Pattern Thickening Material

The method for coating the resist pattern thickening material is not particularly limited and can be selected from the known methods for coating. Examples thereof are roller coating method, dip coating method, spray coating method, bar coating method, kneader coating method, curtain coating method, and the like. Particularly, a spin coating method is preferable. In the case of the spin coating method, the condition is, for instance, a rotation speed of about 100 to 10000 rpm, and the preferable rotation speed is 80 to 5000 rpm. The preferable time is about 1 sec to 10 minutes, and 1 sec to 90 sec is more preferable.

The coating thickness at the time of the coating is usually about 100 to 10,000 angstrom (10 to 1,000 nm), and the preferable thickness is about 1,000 to 5,000 angstrom (100 to 500 nm).

At the time of the coating, the surfactant may be coated separately before coating the resist pattern thickening material in stead of adding the surfactant into the resist pattern thickening material.

Pre-baking (warming and drying) the coated resist pattern thickening material during or before the coating is a preferable method because it efficiently generates mixing (impregnation) of the resist pattern thickening material into the resist pattern at the interface between the resist pattern and the resist pattern thickening material.

The condition and method for pre-baking (warming and drying) are not particularly limited and can be suitably selected according to the purpose. For instance, the number of times of it may be once or two times or more. In the case of two times or more, the temperature of pre-baking may be constant or different each time. When it is constant as mentioned above, the preferable temperature is about 60 to 150° C., and 70 to 120° C. is more preferable. The preferable time is about 30 to 300 sec and 40 to 100 sec is more preferable.

Moreover, the preferable method is when coating baking (mixing baking) is applied to the coated aforementioned resist pattern thickening material after the pre-baking (warming and drying), because the mixing (impregnation) is made to progress efficiently at the interface between the resist pattern and the resist pattern thickening material.

The condition and method for the coating baking (mixing baking) are not particularly limited and can be suitably selected in accordance with the purpose. A condition is adopted with a temperature higher than that of the pre-baking (warming and drying). The condition of the coating baking (mixing baking) is about 60 to 150° C. in the temperature and the preferable temperature is 90 to 130° C. The time is about 30 to 300 sec and the preferable time is 40 to 100 sec.

Moreover, carrying out developing processing of the coated resist pattern thickening material after the coating baking (mixing baking) is preferable. In this case, the advantage is that it is possible to dissolve and remove the part without interacting (mixing) with the resist pattern or the part with a weak interaction (mixing) (the parts having excellent water-solubility) in the coated resist pattern thickening material.

The development may be water development, development using weakly alkaline solution, or a combination thereof. Water development is preferable because development can be carried out efficiently and at low cost.

The step of reducing the width of the gate electrode aperture will be described concretely with reference to the drawing as follows.

Figure 1B:
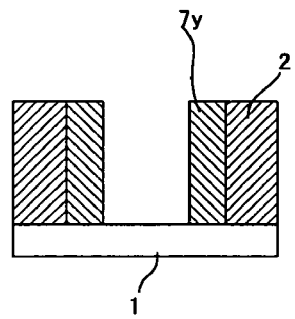
Figure 1C:
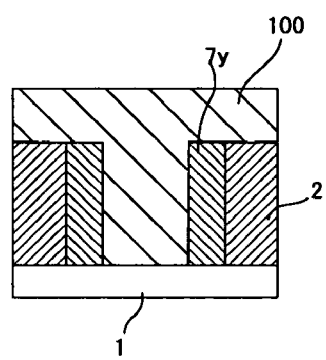

As shown in FIGS. 1A to 1E, after forming the ultraviolet resist layer (i-line resist layer) 2 on the part where a gate electrode 1 is to be formed (FIG. 1A), the trench pattern (gate electrode aperture) is formed by exposing ultraviolet rays (i-line) and developing (FIG. 1B). The light intensity distribution on the ultraviolet resist layer 2 while exposing the ultraviolet rays (i-line) has the highest intensity at the center of the pattern and becomes weaker going away from the center. In this step, the part (strong exposure part 7x), to which light greater than a certain amount is exposed, is dissolved in the developing solution, but the part (weak exposure part 7y and non-exposure part 7z), to which light less than a certain amount is exposed, remains on the substrate. The weak exposure part 7y has higher compatibility with the other resin because of reacting partially with the photosensitizer and soaking the developing solution and rinsing solution.

Figure 1D:
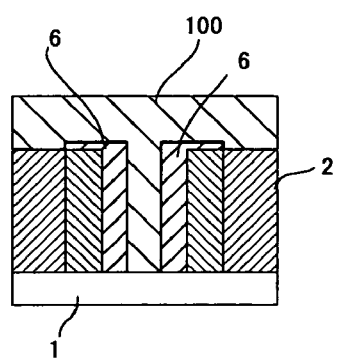
Figure 1E:
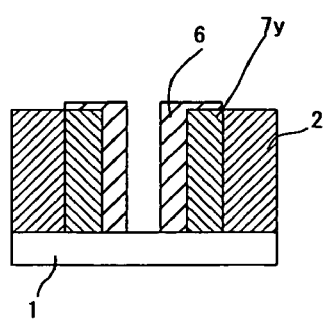

Next, the resist pattern thickening material 100 is applied (coated) on the surface of the ultraviolet resist layer 2 to form the coated layer (FIG. 1C) and the mixing-baking is carried out. Then mixing (impregnation) of the resist pattern thickening material 1 into the ultraviolet resist layer 2 occurs at the interface between the weak exposure part 7y of the ultraviolet resist layer 2 and the resist pattern thickening layer 100, and the mixing layer 6 is formed (FIG. 1D). After that, the part without interacting (mixing) with the ultraviolet resist layer 2 or the part with a weak interaction (mixing) (the parts having high water-solubility) in the applied (coated) resist pattern thickening material 100 is dissolved and removed to form (develop) the mixing layer 6. The development may be water development or development using alkaline solution.

The dimensions of the gate electrode aperture formed in the ultraviolet resist layer 2 is reduced by the mixing layer 6, which is formed by mixing the resist pattern thickening material 100 on the weak exposure part 7y of the ultraviolet resist layer 2, after the step of reducing the width of the gate electrode aperture. Therefore, this step makes it possible to reduce the dimension of the gate electrode aperture exceeding the exposure limit of the light source (i-line) of the exposure device while manufacturing the gate electrode aperture. Namely, it is possible that a fine gate electrode aperture can be manufactured as if it were formed with use of a KrF laser, although it is exposed with use of an i-line (ultraviolet rays).

Step of Forming the Gate Electrode

The step of forming the gate electrode is the one in which the gate electrode is formed in the gate electrode aperture.

The method for forming the gate electrode is not particularly limited and can be suitably selected in accordance with the purpose. For instance, an evaporation method etc. can be given as the preferable example.

The metallic material being evaporated with use of the evaporation method the metallic material being evaporated with use of the evaporation method can be suitably selected from materials known as electrode materials. For instance, Al, Ti, Pt, and Au etc. can be given as the preferable example. These may be used singly, or two or more may be used in combination. Moreover, these metals may be laminated to form the T-type electrode. In this case, the aspects forming the T-type electrode by lamination of, for instance, Ti, Pt, and Au are given as the preferable examples.

Moreover, it is necessary to remove the layer where an over-gate is to be formed after the step of forming the gate electrode. As the method for removing the layer where an over-gate is to be formed, for instance, a lift-off method and etching method are given, and the preferable method is a lift-off method. The conditions of these methods are not particularly limited, and can be suitably selected from known conditions.

In the step of forming the gate electrode, a T-type electrode is fabricated in the aperture formed through the multi-layer resist. Concretely, the base part of the gate electrode is formed at the gate electrode aperture part, and the over-gate part of the gate electrode is formed at the opening part of the layer where an over-gate is to be formed. Then, the gate electrode (mushroom electrode) is obtained by removing the layer where an over-gate is to be formed (and the incompatibility layer, if it is necessary).

Other Steps

The other steps are not particularly limited and can be suitably selected in accordance with the purpose. For instance, the step of engraving the surface where the gate electrode is to be formed is given as the preferable example, in which the side for forming gate electrode is dug down using the gate electrode aperture as the mask.

The part for the gate electrode to be formed is called a "recess region" which is dug by the step of engraving the surface where the gate electrode is to be formed, and the edge wall surface of the "recess region" may be called the "recess edge".

The step of engraving the surface where the gate electrode is to be formed is the step in which the surface where the gate electrode is to be formed is dug using the gate electrode aperture as a mask.

The preferable method for the step of engraving the surface where the gate electrode is to be formed is, for instance, etching. The etching is not particularly limited, for instance, dry-etching is preferable.

The etching conditions are not particularly limited, and can be suitably selected according to the purpose.

The step of engraving the surface where the gate electrode is to be formed is preferably done after the step of forming the gate electrode aperture and before the step of reducing the width of the gate electrode aperture.

Where the step of engraving the surface where the gate electrode is to be formed is done after the step of forming the gate electrode aperture and before the step of reducing the width of the gate electrode aperture, the gate electrode aperture is reduced after the gate electrode aperture is first formed and, using this as a mask, the recess region is formed by engraving. And then, the gate electrode is formed with use of the reduced gate electrode aperture as a mask. Therefore, a shift in position of the recess region and the gate electrode (fine gate electrode) does not occur. Position adjustment while patterning is not necessary because the patterning for forming the recess region (low resistivity removed area) where the gate electrode is formed and the patterning for forming the gate electrode aperture are carried out at the same time. If a position adjustment is necessary, the accuracy for forming the surrounding structure of the gate electrode is determined and limited by the accuracy of the position adjustment. Therefore, the problem arises that a shift in position occurs between the recess region and gate electrode being formed where the accuracy of the position adjustment is not enough and these positions have diverged. In a very high frequency device, the distance from the edge of the gate electrode (fine gate electrode) to the recess edge of the recess area is about 0.1 μm or less and, when they have a variation in the distance caused by the position shift, it lowers the uniformity as far as a device is concerned, causing a frequency drop in the operation circuit, thereby resulting in the problem that a variation in the device properties is generated. However, when the step of engraving the surface where the gate electrode is to be formed is carried out after the step of forming the gate electrode aperture and before the step of reducing the gate electrode, the position adjustment and superposition of layers of the exposure device are not necessary, so that there is no problem like the one mentioned above.

Therefore, the gate electrode manufactured (formed) in the present invention can be preferably used for various semiconductor devices etc., for instance, it can be suitably applied to a field-effect transistor. Particularly, it can be preferably used for a semiconductor device of this invention. Moreover, the semiconductor device can be suitably used as a field-effect transistor or an integrated circuit, etc.

The over-gate part of the gate electrode of the present invention or the over-gate part of the gate electrode in the semiconductor device of the present invention is located in contact with the SiN layer formed on the part for the gate electrode to be formed, or is located, without going through other layers, on the surface where the gate electrode is to be formed.

In the following examples are described the preferred embodiments to illustrate the present invention. However, it is to be understood that the present invention is not intended to be limited to the specific embodiments.

EXAMPLE 1

Preparation of the Rest Pattern Thickening Material (Coating Solution for Compatibility Layer)

The resist pattern thickening materials (coating solution for the compatibility layer) were prepared using the materials shown in Table 1. The numbers in the parenthesis indicate the part by mass. Polyvinyl acetal resin (Sekisui Chemical Co., Ltd. KW-3), polyvinylalcohol resin (Kuraray Co., Ltd. PVA-102) were used for the "resin". Uril=tetramethoxymethyl glycol uril (Sanwa Chemical Co., Ltd.), urea=N,N'-dimethoxymethyl dimethoxyethylene urea (Sanwa Chemical Co., Ltd.), and melamine=hexamethoxymethyl melamine (Sanwa Chemical Co., Ltd.) were used for the crosslinking agent. Moreover, polynuclear phenol ethoxylate surfactants (nonionic surfactant, Asahi Denka Co., Ltd. PC-8), and primary alcohol (nonionic surfactant, Asahi Denka Co., Ltd. TN-80) were used for the surfactant. Furthermore, a mixed solution of deionized water (demineralized water) and isopropyl alcohol was used for the main solvent component (the mass ratio is deionized water (demineralized water): isopropyl alcohol=98.6:0.4).

TABLE 1

| Swelling material name | Resin | Crosslinking agent | Water-soluble aromatic compound | Surfactant |
| --- | --- | --- | --- | --- |
| A | KW-3(16) | Urea (1.0) | None | None |
| B | KW-3(13) PVA(3) | Melamine (0.5) | None | None |
| C | KW-3(16) | Uril (0) | None | None |
| D | KW-3(16) | Uril (0.8) | None | None |
| E | KW-3(16) | Uril (1.0) | None | None |
| F | KW-3(16) | Uril (1.2) | None | None |
| G | KW-3(16) | Uril (1.0) | None | TN-80 (0.0008) |
| H | KW-3(16) | Uril (1.0) | None | TN-80 (0.008) |
| I | KW-3(16) | Uril (1.0) | None | TN-80 (0.08) |
| J | KW-3(16) | Uril (1.0) | None | TN-80 (0.16) |
| K | KW-3(16) | Urea (1.0) | Catechin (5) | None |
| L | KW-3(16) | Urea (1.0) | Catechin (5) | PC-8 (0.05) |

Formation of I-line Resist Pattern

The resist film was formed on a semiconductor substrate using the ultraviolet resist (i-line resist: Sumitomo Chemical Co., Ltd. PFI-32A8), and then the grooved pattern (300 nm in width) was formed by irradiating an i-line (exposure: 190 mJ/cm$^2$) and developing it.

Reduction of Opening Dimensions of the I-line Resist Pattern

Next, the above-mentioned resist pattern thickening material was coated on the i-line resist pattern (grooved pattern) with a width of 300 nm with use of a spin coating method under the conditions of 1000 rpm/5 s at first and then 3,500 rpm/40 s. After the coating baking under the conditions of 85° C./70 s and 90 to 100° C./70 s, the resist pattern thickening material was rinsed for 60 sec using deionized water to remove the part without interacting (mixing) with the resist pattern and the resist pattern thickened by the resist pattern thickening material is developed. Thereby, the opening dimensions were reduced as shown in Table 2. In Table 2, the "Edge roughness reducing material" means the resist pattern thickening material, the "compatibility treatment" means the mixing treatment, and the "opening length" means the opening dimensions.

TABLE 2

| Edge roughness reducing material name | Resist Opening Length (nm) | Opening Length after Compatibility Treatment (nm) | Change in Opening Length (nm) |
| --- | --- | --- | --- |
| A | 311 | 201 | −110 |
| B | 299 | 188 | −111 |
| C | 305 | 236 | −69 |
| D | 309 | 229 | −80 |
| E | 306 | 198 | −108 |
| F | 314 | 179 | −135 |
| G | 303 | 193 | −110 |
| H | 310 | 194 | −116 |
| I | 307 | 186 | −121 |
| J | 300 | 170 | −130 |
| K | 309 | 218 | −91 |
| L | 301 | 204 | −97 |

It is clear from Table 2 that the formation of a mixing layer (compatibility layer) was observed in all of the resist pattern thickening materials (compatibility forming solution) A to L, and a reduction of the opening dimensions was confirmed. Moreover, according to the results of the resist pattern thickening materials C, D, E, F or E, G, H, I, and J, the tendency was observed whereby the opening dimensions was reduced to the extent that the quantity of additives of the crosslinking agent and the surfactant was increased.

Next, the etching resistance was compared between the samples in which the 0.5 μm thick i-line resist layer on the semiconductor substrate was treated with use of the resist pattern thickening materials A, K, and L, respectively, and the reference samples which are treated by UV-6 (Shipley Company L.L.C) and PMMA (polymethyl methacrylate) which are the commercial KrF resists. Using the parallel-plate RIE device, these samples were subjected to an etching treatment under the conditions of Pμ=200 W, pressure=0.02 Torr, and $CF_4$ gas=100 sccm for three minutes.

TABLE 3

| Material name | Etching rate (nm/s) | Rate ratio |
| --- | --- | --- |
| UV-6 | 62.7 | 1.00 |
| PMMA | 77.0 | 1.23 |
| A | 69.6 | 1.11 |
| K | 65.0 | 1.04 |
| L | 66.2 | 1.06 |

According to the results shown in Table 3, it is confirmed that the etching resistance of the resist patterns, which were treated (thickening) with use of the resist pattern thickening materials A, K, and L, is close to that of a KrF resist and greatly superior than that of PMMA.

Experiments of I-Line Resist Pattern Thickening Material

Next five kinds of resist pattern thickening materials (solution for forming the compatibility layer), E, G, H, I and J with different amounts of nonionic surfactant contents (amount of additives), were applied to the apertures of the i-line positive type resist. The contents (amount of additives) of the surfactant added in the resist pattern thickening material (solution for forming the compatibility layer) E, G, H, I and J were controlled to be 0 ppm, 45 ppm, 500 ppm, 5000 ppm and 10000 ppm.

Namely, the 1000 nm thick positive type ultraviolet resist (Sumitomo Chemical Co. Ltd. PFI-32A8) was first coated on the surface of a semiconductor substrate with use of a spin coating process and heat-treated at 110° C. for 90 sec. After coating the resist, a desired gate pattern was exposed with use of an i-line, and a PEB treatment was applied to it at 90° C. for 90 sec. The gate pattern consists of a gate finger pattern with a narrow side length of 0.4 μm×a long side length of 50 μm, and the gate pad pattern with a single length of 20 μm connected to one end of the gate finger pattern. The gate pattern was formed by developing, using 2.38% TMAH for 90 sec after the PEB treatment.

Each of the resist pattern thickening materials (solution for forming the compatibility layer) E, G, H, I and J was coated with use of a spin coating method to yield a thickness of 200 nm after forming the gate pattern. After coating, the mixing layer (compatibility layer) was formed at the resist aperture part by applying heat treatments at 85° C. for 70 sec and 90 to 110° C. for 70 sec continuously. Here, a desired amount of pattern reduction was obtained by controlling the second heat treatment temperature, because the resist pattern thickening materials (solution for forming the compatibility layer) E, G, H, I, and J each have different amounts of mixing layer formation (compatibility layer). After forming the mixing layer (compatibility layer), the resist pattern thickening material (solution for forming the compatibility layer) which did not contribute to the formation of the mixing layer (compatibility layer) was removed by developing (washing) for 60 sec using deionized water. As a result, the resist pattern thickening materials (solution for forming the compatibility layer) E and G could reduce the original opening dimension of 0.4 μm down to 0.2 μm, and the finger pattern connected to the gate pad pattern was also reduced to 0.2 μm. On the other hand, the resist pattern thickening materials (solution for forming the compatibility layer) H, I, and J could reduce the original opening dimension 0.4 μm down to 0.2 μm, but the tendency was observed that the finger pattern connected to the gate pad pattern disappeared.

EXAMPLE 2

Manufacturing Semiconductor Device

As shown in FIGS. 2A to 2K, the buffer layer, InGaAs electron transfer layer, AlGaAs electron donor layer, and GaAs low electrical resistance layer were laminated in order on a semi-insulating GaAs substrate with use of an MOCVD method (not shown in the figure), and the ohmic electrodes (source electrode S and drain electrode D) were formed using the AuGe (20 nm)/Au (200 nm) electrodes after forming the active region by oxygen injection. The surface of the semi-insulating GaAs substrate is the surface where the gate electrode is to be formed 1 as shown in FIGS. 2A to 2K (refer to FIG. 2A).

Figure 2A:
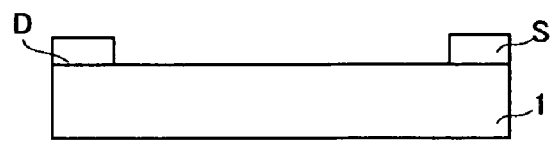
FIGS. 2A to 2K are schematic drawings describing a first example of steps of a method for manufacturing a semiconductor device (method for manufacturing a gate electrode) of the present invention.
Figure 2B:
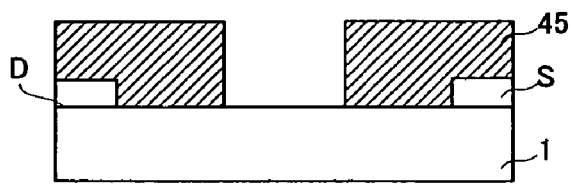
Figure 2C:
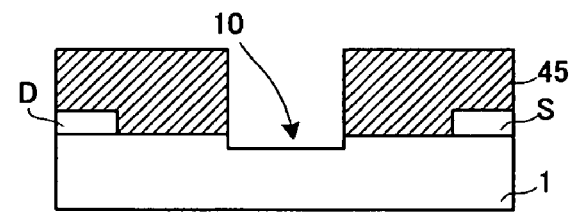
Figure 2D:
Figure 2E:
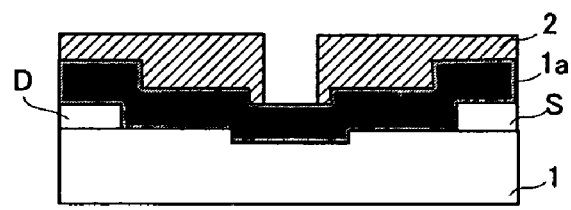
Figure 2F:
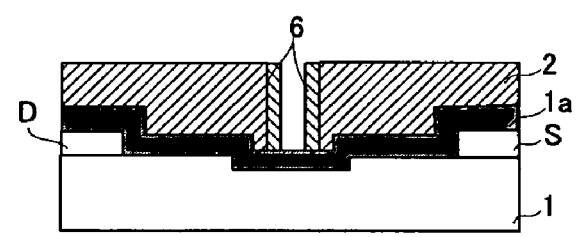

Next, the patterning for forming the recess region was carried out with use of the resist 45 (refer to FIG. 2B). The recess region 10 was formed to a width of 0.6 μm by engraving and removing the low electric resistance layer parts, which region is between both ends of the part where the fine gate (gate electrode) is to be formed in the active region of the surface where the gate electrode is to be formed (refer to FIG. 2C). The above is the step of engraving the surface where the gate electrode is to be formed. Then, the 100 nm thick SiN layer 1a was deposited on the surface where the gate electrode is to be formed 1 (refer to FIG. 2D).

Then, after forming the ultraviolet resist layer 2 on the surface where the gate electrode is to be formed to have a layer thickness of 1000 nm using the positive type ultraviolet resist (Sumitomo Chemical Co. Ltd. PFI-32A8), a PEB treatment was applied at 90° for 90 sec. The gate electrode aperture with a minimum line width 0.4 μm was formed by developing for 90 sec using 2.38% TMAH after applying the PEB treatment (refer to FIG. 2E).

After forming the electrode aperture, the resist pattern thickening material (solution for forming the compatibility layer) G was coated on the ultraviolet resist layer 2 to have a layer thickness of 200 nm. After coating, heat treatments at 95° C. for 70 sec and 105° C. for 70 sec are applied continuously, and the mixing layer 6 (compatibility layer) was formed at the gate electrode aperture. After forming the mixing layer (compatibility layer), the resist pattern thickening material (solution for forming the compatibility layer) G was developed (washed) with deionized water for 60 sec and the resist pattern thickening material (solution for forming the compatibility layer) was removed which does not contribute to the formation of the mixing layer (compatibility layer). After removing it, the 0.4 μm wide aperture was reduced to 0.2 μm (refer to FIG. 2F).

Figure 2G:
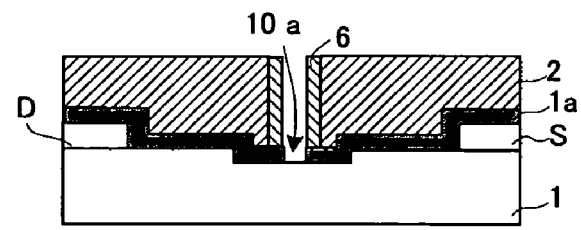

Next, the incompatibility layer (SiN layer) 1a was removed by a dry-etching process using the reduced aperture formed in the ultraviolet layer 2 as a mask and the aperture 10a, which reached the surface where the gate electrode is to be formed, was formed at the reduced aperture part (refer to FIG. 2G). A reactive gas containing SF6 as the main component was used for dry-etching.

Figure 2H:
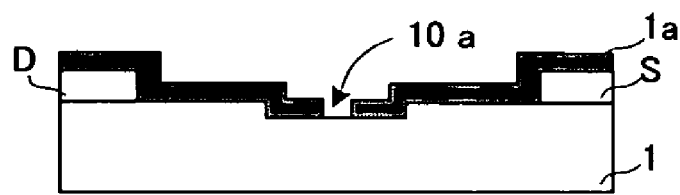
Figure 2I:
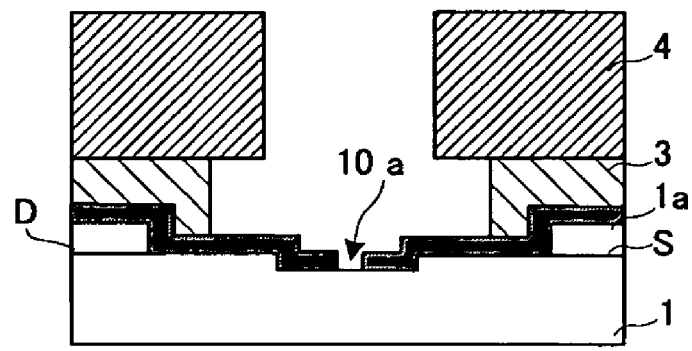

Next, the ultraviolet resist 2 was warmed, peeled off using the aromatic stripping solution (Tokyo Ohka Kogyo Co., Ltd. 502A) and removed (refer to FIG. 2H). After removing, the overhang structure aperture or undercut structure aperture for forming the over-gate was formed right above the gate electrode aperture (refer to FIG. 2I). A multi-layer resist consisting of the PMGI resist layer 3 (500 nm in thickness) and i-line positive type resist layer 4 (1000 nm in thickness) was used as the layer, which can be removed from the side of the surface where the gate electrode is to be formed 1 with use of the side etching treatment, for the formation of the overhang structure for forming the over-gate or undercut structure aperture. After the 0.8 μm wide aperture was formed in the i-line positive type resist layer which was the upper layer determining the over-gate length, the PMGI resist layer located underneath it was etched for 40 sec with use of 2.38% TMAH to form a wider aperture than the aperture of the upper layer. As a result, a multi-layer resist having an overhang structure was formed (refer to FIG. 2I).

Figure 2J:
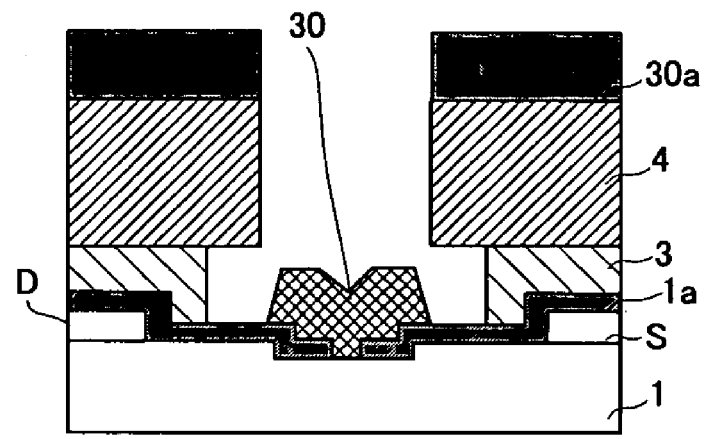

Moreover, Ti (10 nm)/Pt (10 nm)/Au (300 nm) as the gate electrode metals 30a were deposited in order on the surface where the gate electrode 30 is to be formed 1, which surface has the plurality of resist layer, with use of a high vacuum deposition device from the side of the surface where the gate electrode is to be formed (refer to FIG. 2J).

Figure 2K:
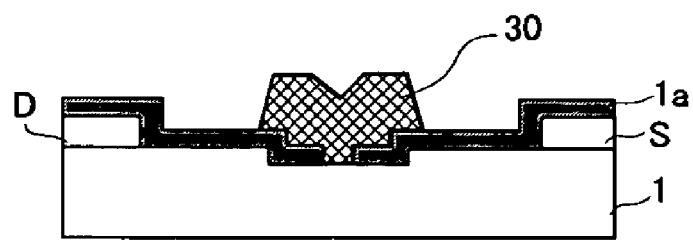

After the deposition, the unnecessary metallic parts were removed by lift-off using warmed MNP to form the mushroom type gate electrode (mushroom gate) (refer to FIG. 2K).

The obtained mushroom gate had a stable dimension (shape) which did not depend on the pattern shape because of the reduction technique of the uniform opening length which did not depend on the shape. Moreover, manufacturing a gate electrode having a length of 0.4 µm or less in the direction of the narrow side became possible, which was not obtained using a conventional i-line exposure technique. The current gain cutoff frequency which is one of the indices to define the performance of the device could be increased to fT=45 GHz which is 50% higher compared with a 0.4 µm device.

EXAMPLE 3

Manufacturing Semiconductor Device

As shown in FIGS. 3A to 3K, the buffer layer, InGaAs electron transfer layer, AlGaAs electron donor layer, and GaAs low electrical resistance layer were laminated in order on a semi-insulating GaAs substrate with use of an MOCVD method (not shown in the figure), and the ohmic electrodes (source electrode S and drain electrode D) were formed using the AuGe (20 nm)/Au (200 nm) electrodes after forming the active region by oxygen injection. The surface of the semi-insulating GaAs substrate is the surface where the gate electrode is to be formed 1 as shown in FIGS. 3A to 3K (refer to FIG. 3A).

Figure 3A:
FIGS. 3A to 3K are schematic drawings describing a second example of steps of a method for manufacturing a semiconductor device (method for manufacturing a gate electrode) of the present invention.
Figure 3B:
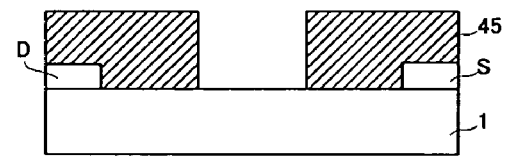
Figure 3C:
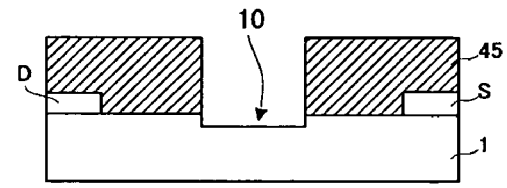
Figure 3D:
Figure 3E:
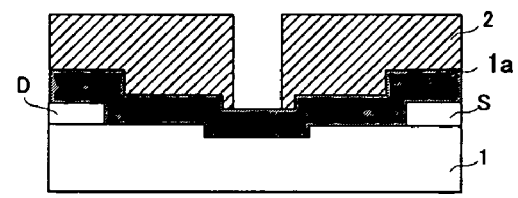

Next, the patterning for forming the recess region was carried out with use of the resist 45 (refer to FIG. 3B). The recess region 10 was formed to a width of 0.6 µm by engraving and removing the low electrical resistance layer parts, which region is between both ends of the part where the fine gate (gate electrode) is to be formed in the active region of the surface where the gate electrode is to be formed (refer to FIG. 3C). The above is the step of engraving the surface where the gate electrode is to be formed. Then, the 100 nm thick incompatibility layer (PMMA layer) 1a was deposited as the incompatibility layer on the surface where the gate electrode is to be formed 1 by coating the anisole solution of polymethyl methacrylate (PMMA) using a spin coating method to have a thickness of 1000 nm (refer to FIG. 3D).

Then, the positive type ultraviolet resist (Sumitomo Chemical Co., Ltd. PFI-32A8) was coated on the surface of the incompatibility layer (PMMA layer) 1a to have a layer thickness of 1000 nm using a spin coating method and subjected to the heat treatment at 110° C. for 90 sec to thereby form a resist layer 2.

After forming the resist layer, a desired gate pattern was exposed to ultraviolet rays (i-line) and a PEB treatment was applied at 90° C. for 90 sec. The gate electrode aperture with a minimum line width of 0.4 µm was formed by developing for 90 sec using 2.38% TMAH after applying the PEB treatment (refer to FIG. 3E).

Figure 3F:
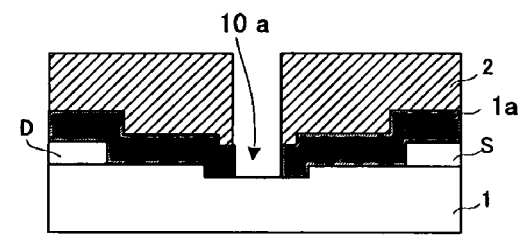
Figure 3G:
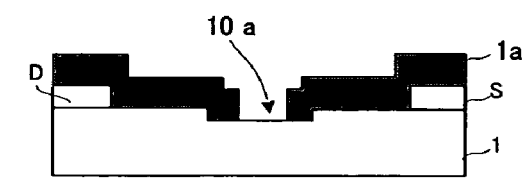
Figure 3H:
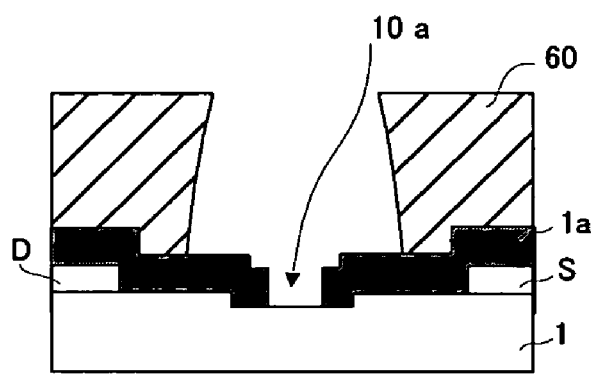
Figure 3I:
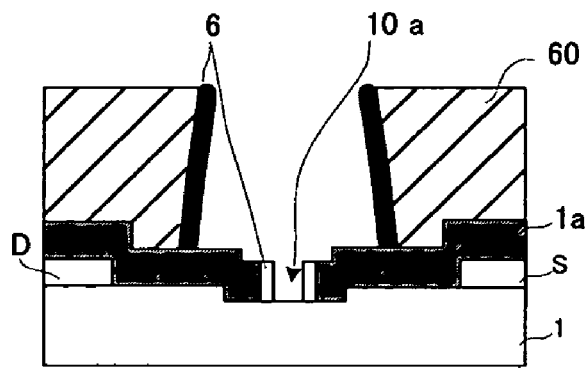

After forming the gate electrode aperture, the aperture having the same size as that of aperture in the resist was transferred to the incompatibility layer 1a (PMMA), which was the under-layer of the resist, using dry-etching (refer to FIG. 3F). After that, the resist layer (positive type ultraviolet resist) was peeled off with use of a resist stripping solution (refer to FIG. 3G).

Next, the overhang structure for forming the over-gate or undercut structure aperture was formed. Namely, a negative resist, which had novolac resin as the main component, was used as the undercut resist to form the aperture for the over-gate. The undercut resist 60 was formed on the incompatibility layer 1a (PMMA layer) where the gate electrode aperture 10a was formed, and by forming a 1.1 µm wide aperture determining the over-gate length, the undercut structure was formed (refer to FIG. 3H).

The resist pattern thickening material (solution for forming the compatibility layer) G was coated on it to have a layer thickness of 500 nm. After coating, heat treatments at 95° C. for 90 sec and 115° C. for 90 sec were applied continuously, and the mixing layer 6 (compatibility later) was formed at the gate electrode aperture 10a of the incompatibility layer 1a (PMMA layer) and the aperture of the undercut resist (refer to FIG. 3I).

After forming the mixing layer (compatibility layer), the resist pattern thickening material (solution for forming the compatibility layer) which did not contribute to the formation of the mixing layer (compatibility layer) was removed by developing (washing) for 60 sec using deionized water. After removing it, the 0.4 µm wide gate electrode aperture of the incompatibility layer 1a (PMMA layer) was reduced to 0.35 µm and the 1.1 µm wide aperture of the undercut resist layer was reduced to 0.8 µm (refer to FIG. 3I).

Figure 3J:
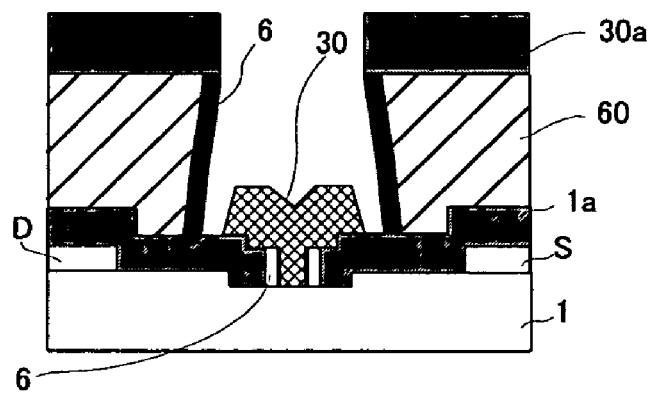
Figure 3K:
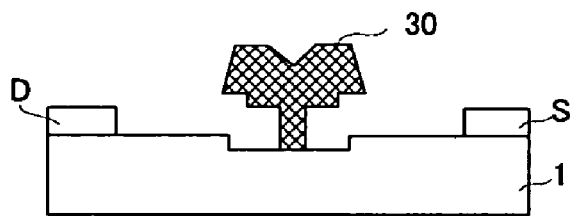

Moreover, Ti (10 nm)/Pt (10 nm)/Au (300 nm) as the gate electrode metals 30a were deposited in order from the side of the surface where the gate electrode 30 is to be formed 1 with use of a high vacuum deposition device (refer to FIG. 3J). After the deposition, the unnecessary metallic parts were removed by lift-off to form the mushroom type gate electrode (mushroom gate) (refer to FIG. 3K)

The mushroom gate obtained had a stable dimension (shape) which did not depend on the pattern shape because of the reduction technique of the uniform aperture dimension which did not depend on the shape. Moreover, manufacturing a gate electrode having a length of 0.4 µm or less in the direction of the narrow side became possible, which was not obtained using a conventional i-line exposure technique. The current gain cutoff frequency which is one of the indices to define the performance of the device could be increased to fT=34 GHz which is 13% higher compared with a 0.4 µm device.

EXAMPLE 4

Manufacturing Semiconductor Device

As shown in FIGS. 4A to 4L, the buffer layer, InGaAs electron transfer layer, AlGaAs electron donor layer, and GaAs low electrical resistance layer were laminated in order on a semi-insulating GaAs substrate with use of an MOCVD method (not shown in the figure), and the ohmic electrodes (source electrode S and drain electrode D) were formed using the AuGe (20 nm)/Au (200 nm) electrodes after forming the active region by oxygen injection. The surface of the semi-insulating GaAs substrate is the surface where the gate electrode is to be formed 1 as shown in FIGS. 4A to 4L (refer to FIG. 4A).

Figure 4A:
FIGS. 4A to 4L are schematic drawings describing a third example of steps of a method for manufacturing a semiconductor device (method for manufacturing a gate electrode) of the present invention.
Figure 4B:
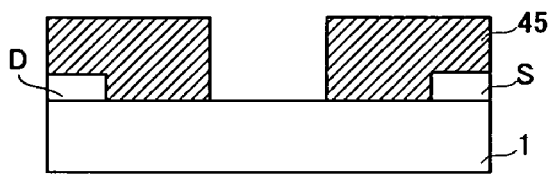
Figure 4C:
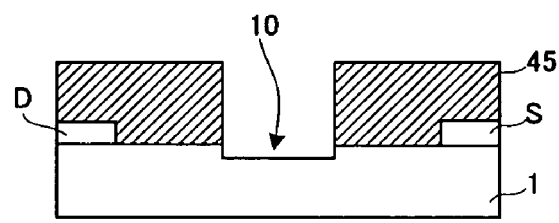
Figure 4D:
Figure 4E:
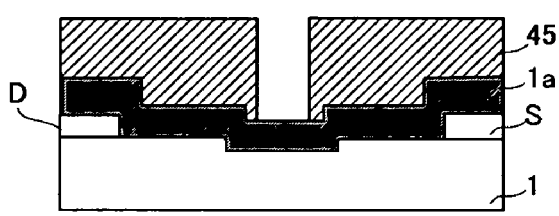
Figure 4F:
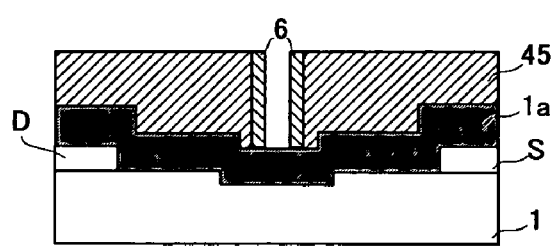
Figure 4G:
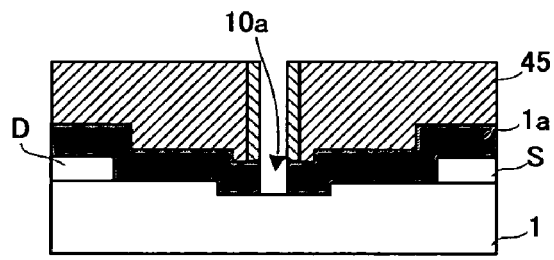
Figure 4H:
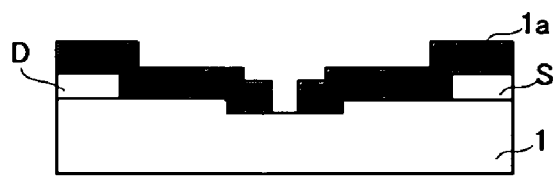
Figure 4I:
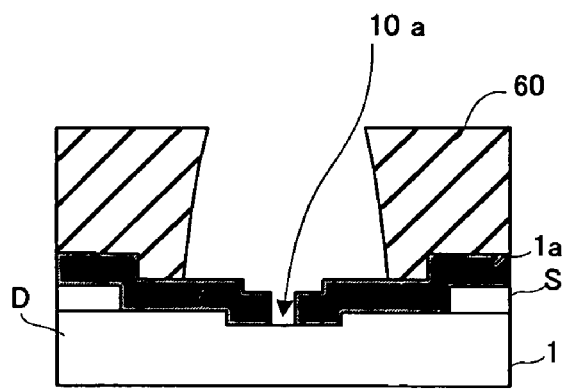
Figure 4J:
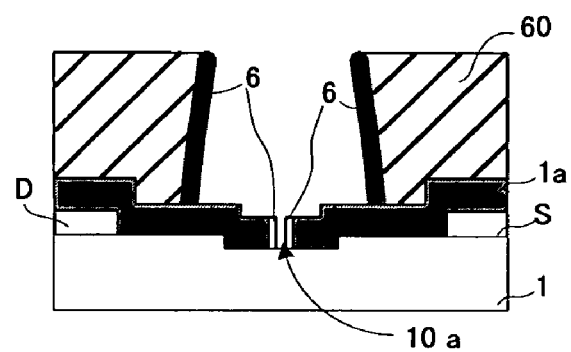
Figure 4K:
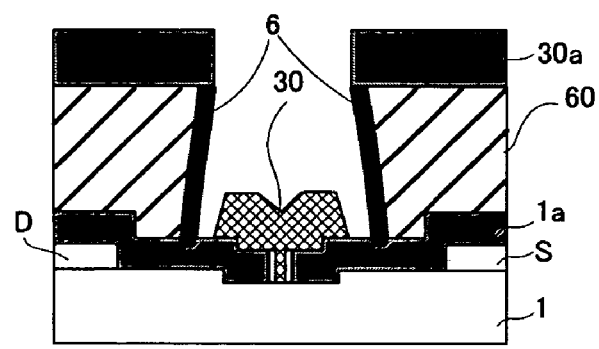
Figure 4L:
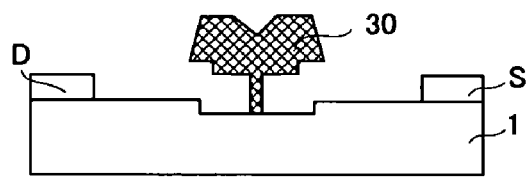

Next, the patterning for forming the recess region was carried out with use of the resist 45 (refer to FIG. 4B). The recess region 10 was formed to a width of 0.6 µm by engraving and removing the low electrical resistance layer parts, which were the two ends of the part forming the fine gate (gate electrode) in the active region of the surface where the gate electrode is to be formed (refer to FIG. 4C). The above is the step of engraving the surface where the gate electrode is to be formed. Then, the 100 nm thick incompatibility layer (PMMA layer) 1a was deposited as the incompatibility layer on the surface where the gate electrode is to be formed 1 by coating the anisole solution of polymethyl methacrylate (PMMA) using a spin coating method to obtain a thickness of 1000 nm (refer to FIG. 4D).

Then, the positive type ultraviolet resist (Sumitomo Chemical Co., Ltd. PFI-32A8) was coated on the surface of the incompatibility layer (PMMA layer) 1a to obtain a layer thickness of 1000 nm using a spin coating method and subjected to the heat treatment at 110° C. for 90 sec to thereby form a resist layer 45.

After forming the resist layer 45, a desired gate pattern was exposed to ultraviolet rays (i-line), and a PEB treatment was applied at 90° C. for 90 sec. The gate electrode aperture with a minimum line width of 0.4 μm was formed by developing for 90 sec using 2.38% TMAH after applying the PEB treatment (refer to FIG. 4E).

The resist pattern thickening material (solution for forming the compatibility layer) G was coated on the ultraviolet resist layer 2 to obtain a layer thickness of 200 nm, and then heat treatments at 95° C. for 70 sec and 105° C. for 70 sec were applied continuously, and the mixing layer (compatibility layer) was formed at the gate electrode aperture. After forming the mixing layer (compatibility layer), it was developed (washed) in deionized water for 60 sec, and the resist pattern thickening material (solution for forming the compatibility layer) which does not contribute to the formation of the mixing layer (compatibility layer) was removed. After removing it, the dimension of the gate electrode aperture with a width of 0.4 μm mentioned above was reduced to 0.2 μm (refer to FIG. 4F).

After that, by doing the same as the Example 3, the gate electrode aperture 10a (the aperture of the PMMA layer) was reduced from 0.2 μm to 0.15 μm (refer to FIGS. 4G to 4J). Moreover, Ti (10 nm)/Pt (10 nm)/Au (300 nm) as the gate electrode metals 30a were deposited in order from one side of the surface where the gate electrode 30 is to be formed 1 with use of a high vacuum deposition device (refer to FIG. 4K). After the deposition, the unnecessary metallic parts were removed by lift-off to form the mushroom type gate electrode (mushroom gate) (refer to FIG. 4L).

The mushroom type gate electrode obtained had a stable dimension (shape) which did not depend on the pattern shape because of the reduction technique of the uniform aperture length which did not depend on the shape. Moreover, manufacturing a gate electrode having a length of 0.4 μm or less in the direction of the narrow side became possible, which was not obtained using a conventional i-line exposure technique. The current gain cutoff frequency which is one of the indices to define the performance of the device could be increased to fT=49 GHz which is 63% higher compared with a 0.4 μm device.

According to the present invention, problems in conventional technologies can be solved and, because the dimensions of aperture are reduced by thickening the gate electrode aperture formed by a normal ultraviolet exposure, it can provide a method for manufacturing a gate electrode and a method for manufacturing a semiconductor device in which a fine gate electrode can be effectively produced. It also provides a gate electrode produced by the method for manufacturing the gate electrode or the method for manufacturing the semiconductor device and being suitable for a field-effect transistor, which has excellent high frequency properties, and useful for a transmitting and receiving device of quasi-millimeter and millimeter band waves and a high-speed signal processing (optical communication) device, and a high quality semiconductor device having the gate electrode.

A method for manufacturing the gate electrode in the present invention is preferably used to manufacture, for instance, gate electrodes (mushroom electrodes) suitable for various semiconductor devices.

A gate electrode of the present invention can be suitably used for various semiconductor devices including flash memory, DRAM, FRAM, magnetic heads, LCD (liquid crystal display), PDP (plasma display panel), and SAW filters (elasticity surface wave filter), etc.

A method for manufacturing a semiconductor device of the present invention can be suitably used for manufacturing various semiconductor devices including flash memory, DRAM, and FRAM, etc.

A semiconductor device of the present invention can be suitably used as flash memory, DRAM, and FRAM, etc.

What is claimed is:

1. A method for manufacturing a semiconductor device, comprising the steps of:
    forming a layer where a gate electrode aperture is to be formed including at least one ultraviolet resist layer on the surface where a gate electrode is to be formed, and forming a gate electrode aperture in the layer where a gate electrode aperture is to be formed;
    forming a layer where an over-gate is to be formed in which an over-gate part of the gate electrode is to be formed, on the layer where a gate electrode aperture is to be formed;
    reducing the width of the gate electrode aperture; and
    forming the gate electrode in the gate electrode aperture.

2. The method for manufacturing a semiconductor device according to claim 1, wherein
    the step of reducing the width of the gate electrode aperture is to be done at least once.

3. The method for manufacturing a semiconductor device according to claim 1, wherein
    the step of reducing the width of the gate electrode aperture is to be done at least once, before and after the step of forming the layer where an over-gate is to be formed, respectively.

4. The method for manufacturing a semiconductor device according to claim 1, wherein
    the layer where a gate electrode aperture is to be formed further comprises an incompatibility layer which is not compatible with the layer where an over-gate is to be formed.

5. The method for manufacturing a semiconductor device according to claim 1, wherein
    the layer where an over-gate is to be formed is an undercut resist layer.

6. The method for manufacturing a semiconductor device according to claim 1, wherein
    the layer where an over-gate is to be formed is a multi-layer resist.

7. The method for manufacturing a semiconductor device according to claim 1, wherein
    the step of forming the gate electrode aperture is carried out by irradiating ultraviolet rays onto the ultraviolet resist layer of the layer where a gate electrode aperture is to be formed.

8. The method for manufacturing a semiconductor device according to claim 1, wherein
    the ultraviolet resist is an i-line resist.

9. The method for manufacturing a semiconductor device according to claim 1, wherein the step of forming the gate electrode is carried out by an evaporation method.

10. The method for manufacturing a semiconductor device according to claim 1, wherein
the gate electrode is a mushroom electrode.

11. The method for manufacturing a semiconductor device according to claim 1, wherein
the step of reducing the width of the gate electrode aperture is carried out by coating, with a resist pattern thickening material containing at least a resin, the region including at least the gate electrode aperture in the layer where a gate electrode aperture is to be formed in which the gate electrode is formed, and by thickening the layer where a gate electrode aperture is to be formed.

12. A semiconductor device which is manufactured with use of a semiconductor-device manufacturing method of claim 1.

13. The method for manufacturing a semiconductor device according to claim 4, wherein
the layer where a gate electrode aperture is to be formed comprises an incompatibility layer and an ultraviolet resist layer in this order on the surface where the gate electrode is to be formed.

14. The method for manufacturing a semiconductor device according to claim 4, wherein
the incompatibility layer comprises at least one selected from the group of acryl resin, polyester resin, polystyrene resin, polyether resin, polyolefin resin, epoxy resin, polyamide resin, and polyimide resin.

15. The method for manufacturing a semiconductor device according to claim 4, wherein
the incompatibility layer is formed by polymethyl methacrylate resin.

16. The method for manufacturing a semiconductor device according to claim 4, wherein
the ultraviolet resist layer is to be removed before the step of forming the layer where an over-gate is to be formed, and the incompatibility layer and over-gate forming layer are to be removed after the step of forming the gate electrode.

17. The method for manufacturing a semiconductor device according to claims 4, wherein
the incompatibility layer is comprised of SiN.

18. The method for manufacturing a semiconductor device according to claim 4, wherein
the incompatibility layer is an ultraviolet resist.

19. The method for manufacturing a semiconductor device according to claim 13, wherein
the incompatibility layer is formed on the surface where the gate electrode is to be formed, in which surface a pair of ohmic electrodes are formed and a recess region is formed, and the gate electrode aperture of the ultraviolet resist layer where the gate electrode aperture is formed is transferred to be formed; and
the layer where an over-gate is to be formed is formed on the incompatibility layer.

20. The method for manufacturing a semiconductor device according to claim 16, wherein
the layer where an over-gate is to be formed is removed by a lift-off method.

21. The method for manufacturing a semiconductor device according to claim 9, wherein
the resin is at least one selected from the group of polyvinyl alcohol, polyvinyl acetal, and polyvinyl acetate.

22. The method for manufacturing a semiconductor device according to claim 9, wherein
the resin contains 5% by mass to 40% by mass of polyvinyl acetal.

23. The method for manufacturing a semiconductor device according to claim 5, wherein
the undercut resist layer is a negative resist layer,
wherein the non-exposed part is dissolved, when the negative layer is exposed and developed, to thereby form an undercut pattern profile.

24. The method for manufacturing a semiconductor device according to claim 5, wherein
the undercut resist layer includes novolac resin, a photo-acid generator, a crosslinking agent, and azo dye.

25. The method for manufacturing a semiconductor device according to claim 6, wherein
the multi-layer resist includes a polydimethyl glutarimide resist layer and an ultraviolet resist layer.

26. The method for manufacturing a semiconductor device according to claim 6, wherein
the ultraviolet resist layer is to be removed before the step of forming the layer where an over-gate is to be formed, and the layer where an over-gate is to be formed is to be removed after the step of forming the gate electrode.

27. The method for manufacturing a semiconductor device according to claim 7, wherein
the ultraviolet rays is 250 nm or more in wavelength.

28. The method for manufacturing a semiconductor device according to claim 11, wherein
the resist pattern thickening material has water-solubility or alkali-solubility.

29. The method for manufacturing a semiconductor device according to claim 11, wherein
the resin has water-solubility or alkali-solubility.

30. The method for manufacturing a semiconductor device according to claim 11, wherein
the resist pattern thickening material includes a surfactant.

31. The method for manufacturing a semiconductor device according to claim 11, wherein
the resist pattern thickening material includes a crosslinking agent.

32. The method for manufacturing a semiconductor device according to claim 11, wherein
the resist pattern thickening material includes a cyclic structure containing compound.

33. The method for manufacturing a semiconductor device according to claim 11, wherein
the resist pattern thickening material includes an organic solvent.

34. The method for manufacturing a semiconductor device according to claim 11, wherein
the resist pattern thickening material includes a phase transfer catalyst.

35. The method for manufacturing a semiconductor device according to claim 11, wherein
the resist pattern thickening material includes a polyhydric alcohol having at least two hydroxyl groups.

36. The method for manufacturing a semiconductor device according to claim 11, wherein
the mixing bake treatment which is a step of baking at 60° C. to 150° C. is applied after coating the resist pattern thickening material.

37. The method for manufacturing a semiconductor device according to claim 11, wherein
a development is carried out after coating the resist pattern thickening material.

38. The semiconductor device according to claim 12, wherein
the over-gate part of the gate electrode is located in contact with the SiN layer formed on the surface where the gate electrode is to be formed, or located, without the interposition of other layers, on the surface where the gate electrode is to be formed.

39. The method for manufacturing a semiconductor device according to claim 30, wherein
the content of a surfactant in the resist pattern thickening material is less than 50 ppm.

40. The method for manufacturing a semiconductor device according to claim 30, wherein
the surfactant is at least one selected from nonionic surfactants, cationic surfactants, anionic surfactants, and ampholytic surfactants.

41. The method for manufacturing a semiconductor device according to claim 30, wherein
the surfactant is selected from the group of polyoxyethylene-polyoxypropylene condensation compounds, polyoxy alkylene alkylether compounds, polyoxy ethylene alkylether compounds, polyoxy ethylene derivative compounds, sorbitan fatty acid ester compounds, glycerine fatty acid ester compounds, primary alcohol ethoxylate compounds, phenol ethoxylate compounds, alkoxylate surfactants, fatty acid ester surfactants, amide surfactants, alcohol surfactants, ethylenediamine surfactants, alkyl cationic surfactants, amide quaternary cationic surfactants, ester quaternary cationic surfactants, amine oxide surfactants, and betaine surfactants.

42. The method for manufacturing a semiconductor device according to claim 31, wherein
the crosslinking agent is at least one selected from the group of melamine derivatives, urea derivatives, and uril derivatives.

43. The method for manufacturing a semiconductor device according to claim 32, wherein
the cyclic structure containing compound has water-solubility in which 1 g or more of the cyclic structure compound is dissolved into one of 100 g of water at a water-temperature of 25° C. and 100 g of 2.38% of tetramethyl ammonium hydroxide aqueous solution at a solution temperature of 25° C.

44. The method for manufacturing a semiconductor device according to claim 32, wherein
the cyclic structure containing compound is at least one selected from the group of aromatic compounds, alicyclic compounds, and heterocyclic compounds.

45. The method for manufacturing a semiconductor device according to claim 33, wherein
the organic solvent is at least one selected from the group of alcohol solvents, linear ester solvents, cyclic ester solvents, ketone solvents, linear ether solvents, and cyclic ether solvents.

46. The method for manufacturing a semiconductor device according to claim 44, wherein
the aromatic compound is selected from the group of polyphenol compounds, aromatic carboxylic acid compounds, naphthalene polyhydric alcohol compounds, benzophenone compounds, flavonoid compounds, their derivatives, and their glycosides;
the alicyclic compound is selected from the group of polycycloalkane, cycloalkane, steroids, their derivatives, and their glycosides;
the heterocyclic compound is selected from the group of pyrrolidine, pyridine, imidazole, oxazole, morpholine, pyrolidone, furan, pyrane, saccharides, and their derivatives.

47. The method for manufacturing a semiconductor device according to claim 37, wherein
the development is carried out with use of deionized water.

48. A method for manufacturing a gate electrode, comprising the steps of:
forming a layer where a gate electrode aperture is to be formed including at least one ultraviolet resist layer on the surface where the gate electrode is to be formed, and forming a gate electrode aperture in the layer where a gate electrode aperture is to be formed;
forming a layer where an over-gate is to be formed in which an over-gate part of the gate electrode is to be formed, on the layer where a gate electrode aperture is to be formed;
reducing the width of the gate electrode aperture; and
forming the gate electrode in the gate electrode aperture.

49. A gate electrode which is fabricated with use of the gate electrode manufacturing method of claim 48.

50. The gate electrode according to claim 49, wherein
the over-gate part is located in contact with the SiN layer formed on the surface where the gate electrode is to be formed, or located, without the interposition of other layers, on the surface where the gate electrode is to be formed.

* * * * *